United States Patent
Yeh

(10) Patent No.: US 9,024,336 B2
(45) Date of Patent: May 5, 2015

(54) DISPLAY PANEL DRIVEN BY ELECTRODE WIRES

(71) Applicant: J Touch Corporation, Taoyuan County (TW)

(72) Inventor: Yu-Chou Yeh, Taoyuan County (TW)

(73) Assignee: J Touch Corporation, Taoyuan County (TW)

( * ) Notice: Subject to any disclaimer, the term of this patent is extended or adjusted under 35 U.S.C. 154(b) by 0 days.

(21) Appl. No.: 13/903,033

(22) Filed: May 28, 2013

(65) Prior Publication Data

US 2014/0353693 A1    Dec. 4, 2014

(51) Int. Cl.
  *H01L 51/00*       (2006.01)
  *H01L 27/12*       (2006.01)
  *H01L 51/52*       (2006.01)

(52) U.S. Cl.
  CPC .......... *H01L 27/124* (2013.01); *H01L 51/5203* (2013.01)

(58) Field of Classification Search
  CPC ................................... H01L 51/5203–51/5234
  See application file for complete search history.

(56) References Cited

U.S. PATENT DOCUMENTS

| | | | |
|---|---|---|---|
| 2006/0012288 A1* | 1/2006 | Terakado et al. | 313/503 |
| 2009/0058784 A1* | 3/2009 | Shin et al. | 345/96 |
| 2009/0256169 A1* | 10/2009 | Yokoyama et al. | 257/98 |
| 2010/0176385 A1* | 7/2010 | Lifka et al. | 257/40 |
| 2010/0314616 A1* | 12/2010 | Kodama et al. | 257/40 |
| 2013/0161178 A1* | 6/2013 | Kim et al. | 200/600 |

FOREIGN PATENT DOCUMENTS

| | | |
|---|---|---|
| JP | H 11-040354 | 2/1999 |
| JP | 2002-343555 A | 11/2002 |
| JP | 2004-311205 A | 11/2004 |
| JP | 2006-245011 A | 9/2006 |
| JP | 2007-201327 A | 8/2007 |
| JP | 2003005221 A | 1/2013 |
| JP | 2013037138 A | 2/2013 |
| JP | 2013-068898 A | 4/2013 |
| WO | WO 2006/103863 A1 | 10/2006 |

* cited by examiner

*Primary Examiner* — Benjamin Sandvik
(74) *Attorney, Agent, or Firm* — Li & Cai Intellectual Property (USA) Office

(57) ABSTRACT

A display panel is provided. The present display panel includes a substrate, a plurality of first electrode wires, a plurality of second electrode wires and a plurality of light-emitting layers, wherein the first electrode wires are disposed on the substrate; the second electrode lines are cross with the first electrode wires and on the first electrode wires; the light-emitting layers are sandwiched between the first electrode wires and the second electrode wires, and are electrically connected to the first electrode wires and the second electrode wires. Thus, the present invention provides a display panel utilizing ultra-fine metal wires as the electrodes, and achieves fine transmittance, high conductivity and facilitating the implementation of the various flexible displays.

17 Claims, 5 Drawing Sheets

DISPLAY PANEL DRIVEN BY ELECTRODE WIRES

BACKGROUND OF THE INVENTION

1. Field of the Invention

The present invention relates to a display panel; in particular, to a display panel driven by the electrode wires.

2. Description of Related Art

Today, generally conventional display technology, such as liquid crystal display (LCD) or organic light-emitting diode (OLED) display, is not only driven by supply voltage or electric field, but also adding a thin film transistor(TFT) switch for each pixel to produce a predetermined grayscale. However, although the display panel comprising the thin film transistor could effectively produce grayscale, the substrate is therefore occupied an additional area by these thin film transistors. Besides, the thin film transistor is not transparent and leads to shield of the light, so that such displays are difficult to improve the resolution.

SUMMARY OF THE INVENTION

A display panel is provided, and more specifically, a display panel comprising ultra-thin metal electrode wires is provided.

The display panel of the present invention comprises a substrate, a plurality of first electrode wires, a plurality of second electrode wires and a plurality of light-emitting layers. The first electrode wires are positioned on the substrate, and the second electrode wires are positioned above the first electrode wires and staggered across the first electrode wires, and the light-emitting layers are disposed between the first electrode wires and the second electrode wires and electrically connect to the first electrode wires and the second electrode wires.

According to an embodiment of the present invention, the material for forming the substrate comprises plastic, glass, silicon substrate or flexible material.

According to an embodiment of the present invention, wherein the material for forming the first electrode wires comprises one of the groups consisting of copper, gold, silver, chromium, nickel, zinc, aluminum, tin, titanium, calcium, magnesium, sodium and its alloys, and the material for forming the second electrode wires is transparent conductive material.

According to an embodiment of the present invention, wherein the material for forming the first electrode wires and the second electrode wires comprises one of the groups consisting of copper, gold, silver, chromium, nickel, zinc, aluminum, tin, titanium, calcium, magnesium, sodium and its alloys, and the aperture ratio of the display panel is between 95% and 99.5%.

According to an embodiment of the present invention, each of the second electrode wires partially covers the light-emitting layers.

According to an embodiment of the present invention, the material for forming the light-emitting layers comprises electrochromic(EC) material, organic light-emitting material or inorganic light-emitting material.

According to an embodiment of the present invention, each of the light-emitting layers emits red light, green light or blue light.

According to an embodiment of the present invention, each of the light-emitting layers emits red light, green light, blue light or yellow light.

According to an embodiment of the present invention, the display panel of the present invention further comprises a plurality of color filters formed on the second electrode wires, and the light-emitting layers emits white light in the meanwhile.

According to an embodiment of the present invention, each of the light-emitting layers is one of the groups consisting of circular, triangular, square and hexagonal.

According to an embodiment of the present invention, the display panel of the present invention further comprises a protective layer formed on the second electrode wires, and the material for forming the protective layer comprises nitrogen silicide.

According to an embodiment of the present invention, the display panel of the present invention further comprises an insulating layer formed between the substrate and the second electrode wires, and the material for forming the insulating layer comprises oxygen silicide or polymer.

According to an embodiment of the present invention, at least one light-emitting layer is covered by more than one second electrode wires.

According to an embodiment of the present invention, the display panel of the present invention further comprises further comprises an external driving circuit connected to the first electrode wires and the second electrode wires electrically.

By the arrangement mentioned above, the display panel of the present invention could replace the thin film transistor with external driving circuit, such as a wafer, to adjust the voltage of the first electrode wires and the second electrode wires, thus achieving the control to the light emission of each light-emitting layer.

In order to further the understanding the techniques, methods, and efficacy taken in the present invention to achieve the purpose, the following embodiments are provided along with specifications, illustrations, objects features and characteristics to facilitate the disclosure of the present invention. However, the accompanying drawings and attachments are only provided for reference and description and not intended to limit the present invention.

DETAILED DESCRIPTION OF THE EMBODIMENTS

A display panel of the present invention will be explained below through the embodiments. It has to be mentioned, the embodiments of the present invention are not intended to limit the present invention implementing in any specific environment, applications, or particular manner as described below. Therefore, the description of the embodiments only explains the purpose of the invention, not to limit the present invention.

Figure 1:
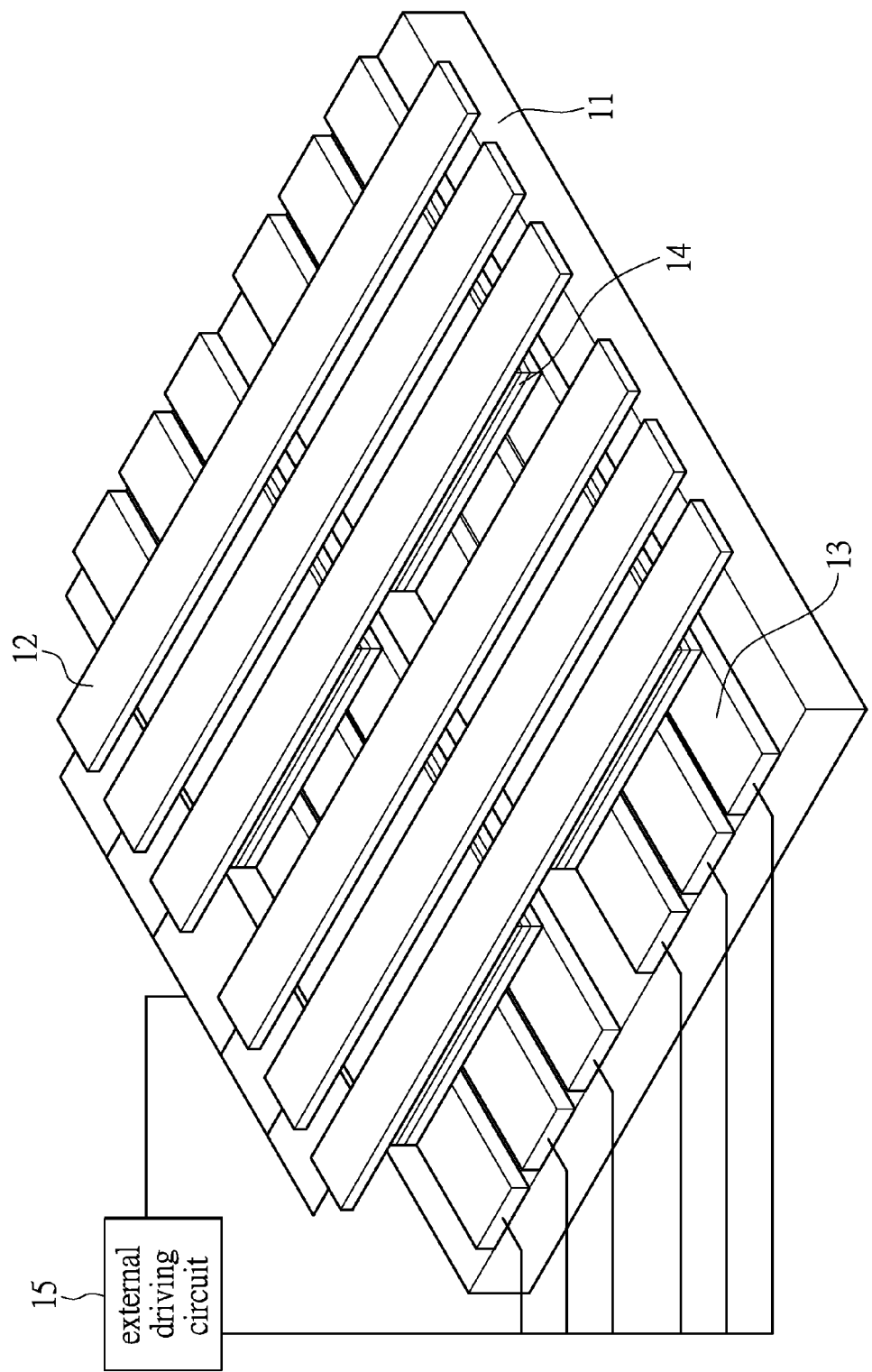
FIG. 1 shows a perspective view of the display panel according to an embodiment of the present invention.

Please refer to FIG. 1, a perspective view of the display panel according to an embodiment of the present invention is provided. In this embodiment, the display panel of the present invention comprises a substrate 11, a plurality of first electrode wires 13, a plurality of the second electrode wires 12, a plurality of the light-emitting layer 14 and an external driving circuit 15, wherein the first electrode wires 13 are positioned on the substrate 11, and the second electrode wires 12 are positioned above the first electrode wires and staggered across the first electrode wires, and the light-emitting layers 14 are disposed between the first electrode wires 13 and the second electrode wires 12 and electrically connected to the first electrode wires 13 and the second electrode wires 12, and the external drive circuit 15 is electrically external connection to the first electrode wires 13 and the second electrode wires 12.

Generally speaking, the external driving circuit 15 may be a chip installed on the substrate 11, but not be limited to.

In practice, the first electrode wires 13 and the second electrode wires 12 provide the voltage to drive the light-emitting layers 14 emit light, and adjust the voltage of the first electrode wires 13 and the second electrode wires 12 by the external driving circuit 15, thereby to control the light emission of the light-emitting layers 14.

In the present invention, the quantity and arrangement of the first electrode wires 13, the second electrode wires 12 and the light-emitting layers 14 are not particularly limited, for example, it could be changed depending on the circumstances and be arranged in a first electrode wire 13 and a second electrode wire 12 matched with a light-emitting layer 14, a plurality of first electrode wires 13 and a second electrode wire 12 matched with a light emitting layer 14, a first electrode wire 13 and a plurality of second electrode wires 12 matched with a light-emitting layer 14, or even a plurality of first electrode wires 13 and a plurality of second electrode wires 12 matched with a light-emitting layer 14, and however, it is not limited to.

It has to be mentioned, the second electrode wires 12 of the present display panel are located above the light-emitting layers 14, and the each second electrode wire 12 only partially cover the light-emitting layer 14 to reduce the light-emitting layer 14 emitting light blocked by the second electrode wires 12, thus to enhance the brightness.

Furthermore, in the present invention, a single light-emitting layer 14 emits a single color light, such as red, green or blue, and however, depending on the demand, it could be the yellow light in order to improve the color field of the present invention to make the image colorful.

In the present invention, the material of the substrate 11 may include plastic, glass, silicon substrate or a flexible polymer material, such as polyimide(PI), polyethylene terephthalate(PET) and so on. The material of the light-emitting layer 14 may use the conventional display material including electrochromic(EC), organic light emitting material or inorganic light emitting material. But above description only can be just a reference, the material are not limited.

In an embodiment of the present invention, the material of the first electrode wires 13 may use the conventional metal electrode material including one of the groups consisting of copper, gold, silver, chromium, nickel, zinc, aluminum, tin, titanium, calcium, magnesium, sodium and its alloys, with the material of the second electrode wires 12 are transparent conductive material, such as indium tin oxide (ITO) and indium zinc oxide (IZO). Preferably, the width of the second electrode wires 12 is less than or equal to 10 μm to improve the light transmittance of the present display panel.

In an embodiment of the present invention, the material of the first electrode wires 13 and the second electrode wires 12 may use the conventional metal electrode material including one of the groups consisting of copper, gold, silver, chromium, nickel, zinc, aluminum, tin, titanium, calcium, magnesium, sodium and its alloys at the same time. Preferably, the width of the second electrode wires 12 is less than or equal to 10 μm, but it is not limited to.

By the above-described configuration, the aperture ratio formed by the display panel of the present invention is preferably in the range of between 95% and 99.5%.

Figure 2:
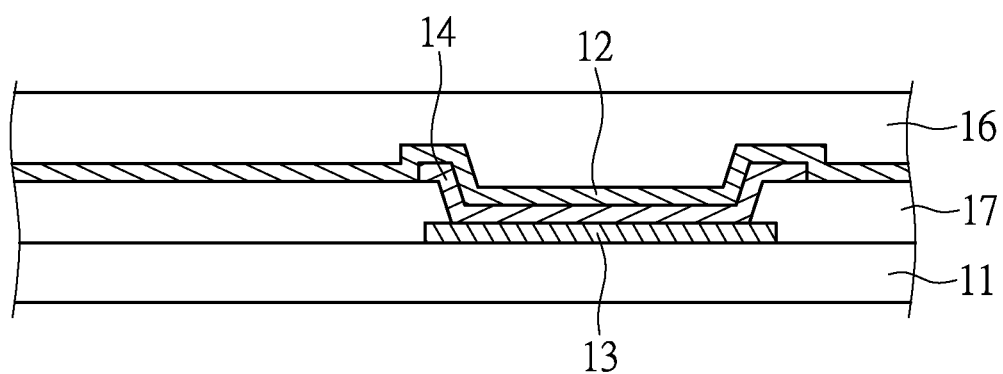
FIG. 2 shows a cross-sectional view of the display panel of the present invention.
Figure 3A:
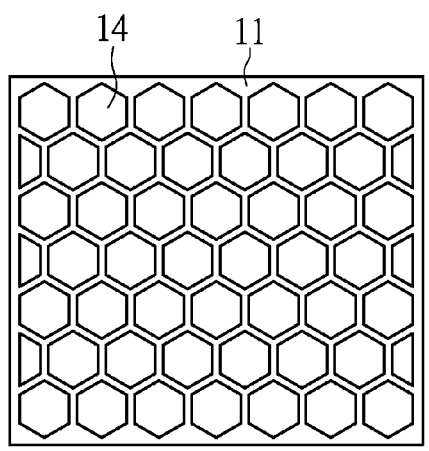
FIG. 3A-3D shows schematic diagrams of the light-emitting layers of the present invention arranged in different pattern.
Figure 3B:
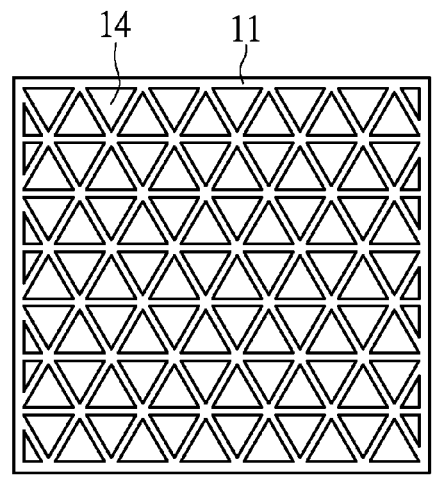
Figure 3C:
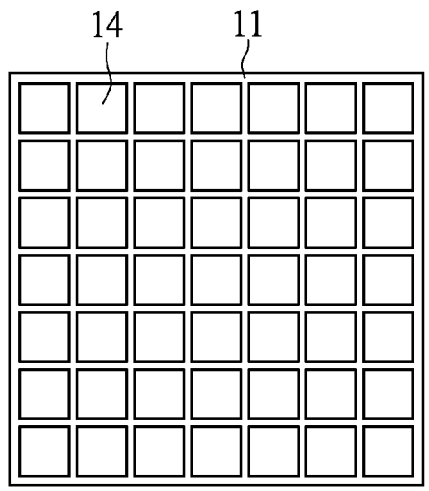
Figure 3D:
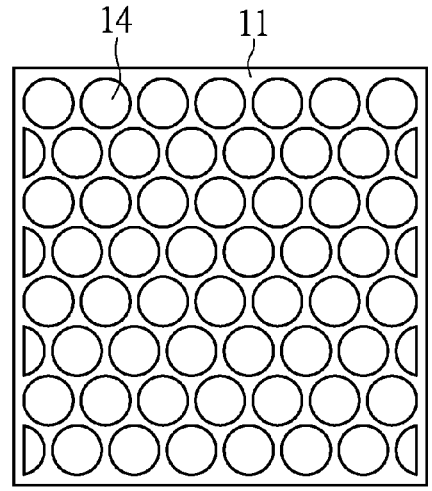

Next, please refer to FIG. 2, it shows the cross-sectional view of the present display panel. In an embodiment of the present invention, the display panel of the present invention, in addition to the above-described configuration, further comprises a protective layer 16 and an insulating layer 17, wherein the protective layer 16 is formed on the second electrode wires 12 to protect the first electrode wires 13, the second electrode wires 12 and the light-emitting layers 14 from moisture penetration, thus the material for forming the protective layer 16 includes any waterproof materials such as nitrogen silicide, but it is not limited to; the insulating layer 17 is formed between the substrate 11 and the second electrode wires 12 to prevent the short-circuit occurred between the first electrode wires 13 and the second electrode wires 12, and therefore the material for forming the insulating layer 16 comprises any non-conductive materials such as oxygen silicide or polymer, but it is not limited to.

Then referring to FIG. 3A-3D, they shows schematic diagrams of the light-emitting layers 14 of the present invention arranged in different pattern. In the present display panel, the shape of the light-emitting layer 14 is depending on demand and not limited to, for example, it could be circular, triangular, square, hexagonal and so on, and may be arranged in an array as shown in FIG. 3A-3D, but not be limited.

Figure 4:
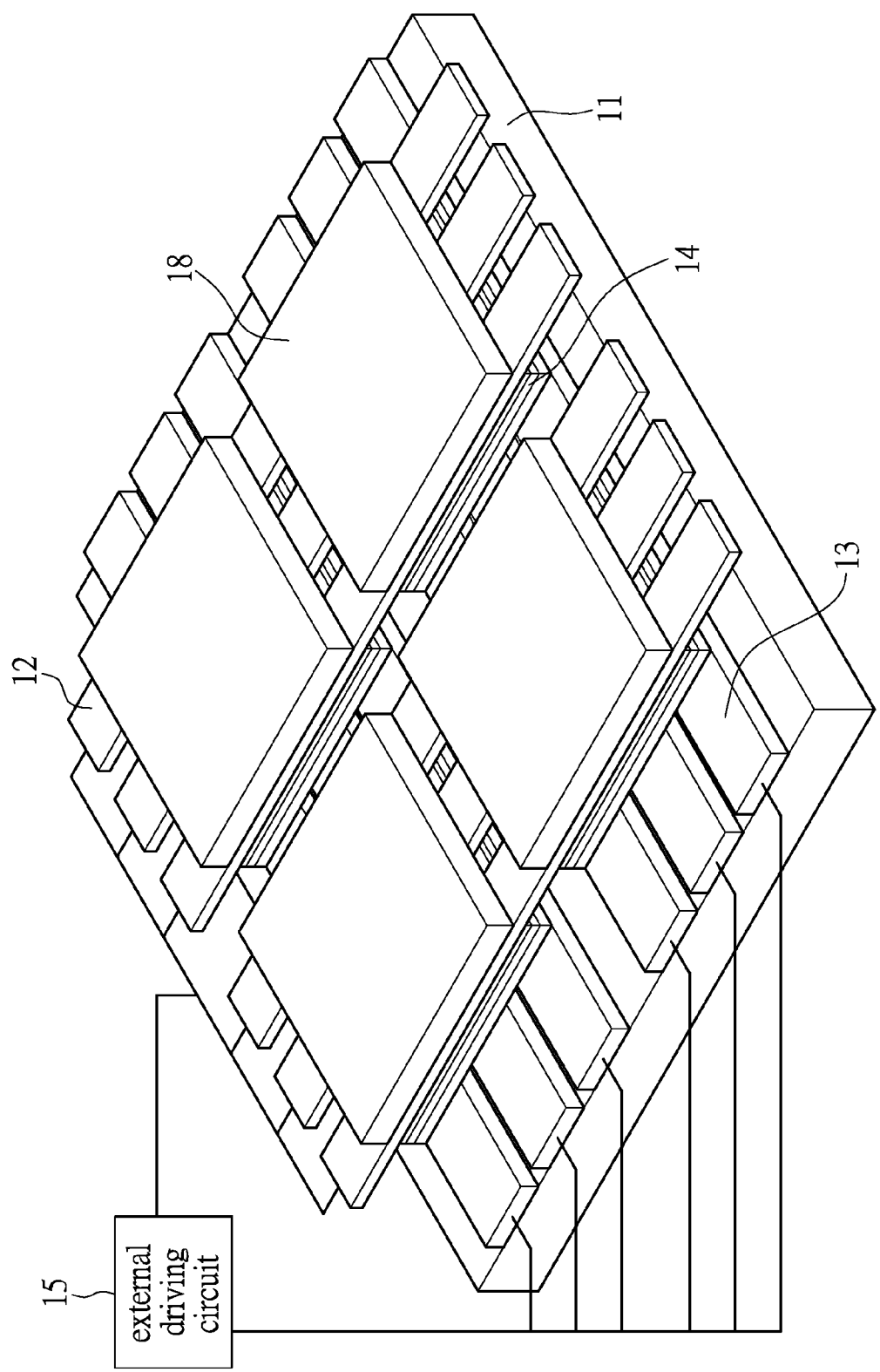
FIG. 4 shows a perspective view of the display panel of the present invention further comprising a plurality of color filters.
Figure 5:
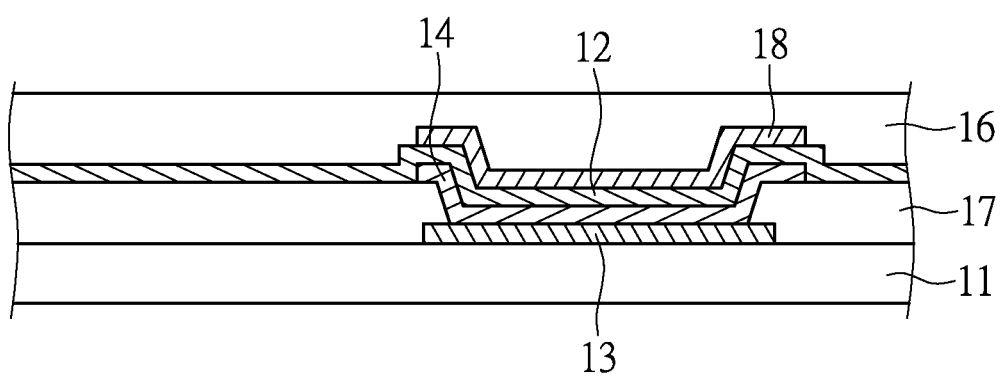
FIG. 5 shows a cross-sectional view of the display panel of the present invention further comprising a plurality of color filters.

In an embodiment of the present invention, the present display panel further includes a plurality of color filters 18 as shown in FIG. 4. The color filters 18 are formed on the second electrode wires 12, preferably, are just formed above the light-emitting layers 14 as shown in FIG. 5. In this embodiment, the light emitting layers 14 emit white light, and then the color of the outgoing light is determined by the color filters 18.

In summary, the present invention provides a display panel driven to be controlled by the electrode wires but not using the thin film transistor (TFT). Besides, the using ultra-fine metal wires for the second electrode wires on the light-emitting layers will not block the light emission, and therefore the light transmittance is not affected and the display panel has high conductivity. At the same time, the display panel of the present invention uses the ultra-fine electrode wires with the flexible substrate to implement as a variety of flexible displays.

The foregoing is only possible embodiments of the present invention, where any modifications and alterations in accordance with the claims of the present invention are also belong to the scope of the present invention.

What is claimed is:

1. A display panel comprising:
   a substrate;
   a plurality of first electrode wires positioned on the substrate;
   a plurality of second electrode wires positioned above the first electrode wires and staggered across the first electrode wires;

a plurality of light-emitting layers disposed between the first electrode wires and the second electrode wires;

wherein the light-emitting layers electrically connect to the first electrode wires and the second electrode wires; and a protective layer formed on the second electrode wires, wherein the material for forming the protective layer comprises nitrogen silicide.

2. The display panel according to claim 1, wherein the width of each of the first electrode wires is less than or equal to 10 μm.

3. The display panel according to claim 2, wherein the material for forming the first electrode wires comprises one of the groups consisting of copper, gold, silver, chromium, nickel, zinc, aluminum, tin, titanium, calcium, magnesium, sodium and its alloys, and the material for forming the second electrode wires is transparent conductive material.

4. The display panel according to claim 1, wherein the width of each of the second electrode wires is less than or equal to 10 μm.

5. The display panel according to claim 4, wherein the material for forming the first electrode wires and the second electrode wires comprises one of the groups consisting of copper, gold, silver, chromium, nickel, zinc, aluminum, tin, titanium, calcium, magnesium, sodium and its alloys.

6. The display panel according to claim 4, wherein each of the second electrode wires partially cover the light-emitting layers, and the aperture ratio formed by these second electrode wires is between 95% and 99.5%.

7. The display panel according to claim 1, wherein the material for forming the substrate comprises plastic, glass, silicon substrate or flexible material.

8. The display panel according to claim 1, wherein the material for forming the light-emitting layers comprises electrochromic (EC) material, organic light-emitting material or inorganic light-emitting material.

9. The display panel according to claim 1, wherein each of the light-emitting layers emits red light, green light or blue light.

10. The display panel according to claim 1, wherein each of the light-emitting layers emits red light, green light, blue light or yellow light.

11. The display panel according to claim 1, wherein each of the light-emitting layers emits white light.

12. The display panel according to claim 11, further comprises a plurality of color filters formed on the second electrode wires.

13. The display panel according to claim 1, wherein each of the light-emitting layers is one of the groups consisting of circular, triangular, square and hexagonal.

14. The display panel according to claim 1, further comprises an insulating layer formed between the substrate and the second electrode wires.

15. The display panel according to claim 14, wherein the material for forming the insulating layer comprises oxygen silicide or polymer.

16. The display panel according to claim 1, wherein at least one light-emitting layer is covered by more than one second electrode wires.

17. The display panel according to claim 1, further comprises an external driving circuit connected to the first electrode wires and the second electrode wires electrically.

* * * * *